(12) United States Patent
Malyna et al.

(10) Patent No.: US 9,516,720 B2
(45) Date of Patent: Dec. 6, 2016

(54) SURGE-PROTECTION ARRANGEMENT (71) Applicant: PHILIPS LIGHTING HOLDING B.V., Eindhoven (NL)

(72) Inventors: Dmytro Viktorovych Malyna, Eindhoven (NL); Eugen Jacob De Mol, Eindhoven (NL); Paul Joseph Maria Beerens, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 15/030,579

(22) PCT Filed: Nov. 4, 2014

(86) PCT No.: PCT/EP2014/073615
§ 371 (c)(1),
(2) Date: Apr. 19, 2016

(87) PCT Pub. No.: WO2015/063310
PCT Pub. Date: May 7, 2015

(65) Prior Publication Data
US 2016/0270161 A1 Sep. 15, 2016

(30) Foreign Application Priority Data

Nov. 4, 2013 (EP) .................................. 13191346

(51) Int. Cl.
*H05B 37/00* (2006.01)
*H05B 39/00* (2006.01)
(Continued)

(52) U.S. Cl.
CPC ........... *H05B 33/089* (2013.01); *F21V 23/003* (2013.01); *F21V 29/70* (2015.01); *H01L 25/0753* (2013.01);
(Continued)

(58) Field of Classification Search
None
See application file for complete search history.

(56) References Cited

U.S. PATENT DOCUMENTS 5,491,399 A  2/1996 Allen, Jr.
6,400,534 B1  6/2002 Klaassen
(Continued)

FOREIGN PATENT DOCUMENTS

CN  202050237 U  11/2011
EP  1139019 A1  10/2001
GB  2399236 A   9/2004

*Primary Examiner* — Anh Tran (57) ABSTRACT

The invention describes a surge-protection arrangement (1) for an electronic device (3) comprising a heat-dissipating load (10) thermally connected to a heat sink (107) of the load (10), which surge protection arrangement (1) comprises at least one high impedance arrangement ($Z_{HI}$, $Z_{HI\_N}$, $Z_{HI\_P}$) connected in series with the load (10); at least one low impedance arrangement ($Z_{LO}$, $Z_{LO\_N}$, $Z_{LO\_P}$) connected in parallel with the load (10); and a ground connection (FE) arranged to electrically connect the heat sink (107) and a low impedance arrangement ($Z_{LO}$, $Z_{LO\_N}$, $Z_{LO\_P}$); wherein the high-impedance arrangement ($Z_{HI}$, $Z_{HI\_N}$, $Z_{H\_IP}$) is realized to discourage a common-mode surge current (Is) from entering the load (10), and the low-impedance arrangement ($Z_{LO}$, $Z_{LO\_N}$, $Z_{LO\_P}$) is realized to encourage a common-mode surge current (Is) to bypass the load (10) into a ground connection (FE). The invention further describes an electronic device (3) comprising a load (10) with a number of heat-dissipating components (100) thermally connected to a heat sink (107) of the load (10); a driver (20) realized to drive the load (10); and such a surge protection arrangement (1). The invention also describes a driver (20) realized to drive an LED lighting circuit (10) and comprising such a surge protection arrangement (1); and a method of providing protection against a common-mode surge current (Is)

(Continued)

through an electronic device (3) comprising a heat-dissipating load (10) thermally connected to a heat sink (107) of the load (10).

15 Claims, 6 Drawing Sheets

(51) Int. Cl.
*H05B 41/14* (2006.01)
*H05B 33/08* (2006.01)
*F21V 29/70* (2015.01)
*F21V 23/00* (2015.01)
*H01L 33/64* (2010.01)
*H01L 33/62* (2010.01)
*H01L 33/54* (2010.01)
*H01L 33/48* (2010.01)
*H01L 25/075* (2006.01)
*F21Y 101/02* (2006.01)
*F21Y 103/00* (2016.01)

(52) U.S. Cl.
CPC ............. *H01L 33/486* (2013.01); *H01L 33/54* (2013.01); *H01L 33/62* (2013.01); *H01L 33/642* (2013.01); *H05B 33/083* (2013.01); *F21Y 2101/02* (2013.01); *F21Y 2103/003* (2013.01)

(56) References Cited

U.S. PATENT DOCUMENTS

| | | |
|---|---|---|
| 8,025,424 B2 | 9/2011 | Mondloch |
| 8,531,811 B2 * | 9/2013 | Ruess .................... H02H 9/042 |
| | | 111/118 |
| 2005/0036262 A1 * | 2/2005 | Siebenthall .......... H03H 1/0007 |
| | | 361/118 |
| 2010/0127625 A1 | 5/2010 | Abdelsamed |
| 2010/0277905 A1 | 11/2010 | Doubek |
| 2011/0299203 A1 | 12/2011 | Hoepfner |
| 2013/0193861 A1 | 8/2013 | Harrington |

* cited by examiner

SURGE-PROTECTION ARRANGEMENT

CROSS-REFERENCE TO PRIOR APPLICATIONS

This application is the U.S. National Phase application under 35 U.S.C. §371 of International Application No. PCT/EP2014/073615, filed on Nov. 4, 2014, which claims the benefit of European Application No. 13191346.9, filed on Nov. 4, 2013. These applications are hereby incorporated by reference herein.

FIELD OF THE INVENTION

The invention describes a surge-protection arrangement, an electronic device, a driver of an electronic device; and a method of providing protection against a surge current.

BACKGROUND OF THE INVENTION

Lighting solutions based on energy-efficient light-emitting diodes (LEDs) are becoming more widespread. However, a relatively high failure rate of LED panels (strings of LEDs arranged on a heatsink) used in some LED lighting solutions has been observed. Current surges have been identified as the cause of many of the failures. It is known that a common-mode current surge is facilitated by certain types of LED driver in which a "Y-capacitor" is arranged across the primary and secondary windings of the driver transformer. Such a transformer is required for providing the necessary DC operating voltage and current for the LEDs, and a Y-capacitor is used to reduce electromagnetic interference (EMI). The occurrence of a current surge at the driver cannot be reliably prevented, and such a current surge can pass through the Y-capacitor and enter the LED panel. The usual LED panel design further facilitates surge current damage, since this generally includes unavoidable parasitic capacitances between thermal pads of the LEDs and a ground or earth connection. During a current surge, these capacitors become charged, and since the LEDs effectively lie in the surge current path because the thermal pads are electrically connected to the LEDs, the peak current also passes through the LEDs and may destroy them.

It is known that the usual Y-capacitor between primary and secondary sides of the driver provides a path for a surge current from the primary side to the secondary side. One way of avoiding LED damage is to split or actually remove the Y-capacitor from between the primary and secondary sides of the driver. However, the Y-capacitor is part of the driver's EMI damping system, and splitting or even removing this capacitor introduces a severe penalty to the EMI performance of the driver. A solution with split Y-capacitor can result in severe increase in EMI, for example by a factor of ten.

Another solution is to bypass each individual LED by a capacitor, so that a surge current will take the path through the bypass capacitor rather than through the LED. However, adding such bypass capacitors to an LED board requires custom LED board design, which may be prohibitively expensive or commercially unrealistic.

Both of the known solutions provide a good level of surge protection, but are associated with penalties that have a negative impact on other performance criteria of a luminaire or the cost of realization.

Therefore, it is an object of the invention to provide an LED lighting circuit that avoids the problems described above.

SUMMARY OF THE INVENTION

The object of the invention is achieved by the surge-protection arrangement of claim 1; by the electronic device of claim 9; by the driver of claim 14; and by the method of claim 15 of providing protection against a common-mode surge current.

According to the invention, the surge-protection arrangement for an electronic device comprises a heat-dissipating load thermally connected to a heat sink of the load, which surge protection arrangement comprises at least one high impedance arrangement connected in series with the load; at least one low impedance arrangement connected in parallel with the load; and a ground connection arranged to electrically connect the heat sink and a low impedance arrangement; wherein the high-impedance arrangement is realized to discourage a common-mode surge current from entering the load, and the low-impedance arrangement is realized to encourage a common-mode surge current to bypass the load into the ground connection.

An advantage of the surge-protection arrangement according to the invention is that in a relatively simple and straightforward manner, reliable surge protection is provided without having to compromise other aspects of device design. For instance, if the load is an LED lighting unit, cheap and readily available LED panels can be used since it is not necessary to include bypass capacitors for each LED of the panel. Another advantage of the surge-protection arrangement according to the invention is that it does not involve any alteration to the EMI damping system of a driver, so that the EMI emission level of a device that uses such a surge-protection arrangement is comparable to the known type of device based on a Y-capacitor between primary and secondary driver sides, so that the surge-protection arrangement according to the invention is "EMI-neutral". The surge-protection arrangement according to the invention can be incorporated in a driver for the load; it may be incorporated in the load; or it can be realized as a separate module.

The inventive surge-protection arrangement or surge-protection circuit effectively re-directs the surge current from an LED board or panel to the ground by adding it to the output of the driver, and makes use of the electrical connection between heatsink and ground. Such a ground connection is generally referred to as a "functional earth" (FE). The surge-protection arrangement according to the invention works by effectively changing the impedance of the load board as "seen" by the common-mode surge current: it effectively increases the series impedance of the load (discouraging the surge current from entering the load) and reduces the parallel impedance of the load (offering the surge current an easier path to ground).

According to the invention, the electronic device comprises a load with a number of heat-dissipating components mounted on a circuit board and thermally connected to a heat sink of the load; a driver realized to drive the load; and such a surge protection arrangement.

An advantage of the electronic device according to the invention is that the components of the load are protected from surge current damage at all times, so that the electronic device according to the invention can ensure a favorably high level of device reliability, which is a very important consideration if a product is to be associated with high consumer satisfaction.

According to the invention, the driver realized to drive an LED lighting circuit, which driver comprises such a surge protection arrangement arranged for connection to the LED lighting circuit.

An advantage of the driver according to the invention is that the surge-protection arrangement can be incorporated into the driver itself, so that a single type of driver can provide reliable surge protection when used in conjunction with various different types of LED panels or boards.

According to the invention, the method of providing protection against a common-mode surge current through an electronic device that has a heat-dissipating load thermally connected to a heat spreader of a circuit board comprises the steps of connecting at least one high impedance arrangement in series with the load; connecting at least one low impedance arrangement in parallel with the load; and electrically connecting a ground connection between the heatsink and a low impedance arrangement; such that the common-mode surge current is discouraged by the high impedance arrangement from entering the load and encouraged by the low impedance arrangement to bypass the load into the ground connection.

An advantage of the method according to the invention is that a "safe" path is provided to a surge current, and this safe path effectively circumvents the components of the heat-dissipating load. For example, these components may be LEDs of an LED panel, and since the LEDs are not in the surge current path, they will not be damaged in the ultimately unavoidable event of a current surge through the device.

The dependent claims and the following description disclose particularly advantageous embodiments and features of the invention. Features of the embodiments may be combined as appropriate. Features described in the context of one claim category can apply equally to another claim category.

The heat-dissipating load can be any load that generates heat during operation. In the following, but without restricting the invention in any way, it may be assumed that a load comprises a lighting circuit with heat-dissipating light-emitting diodes (LEDs) mounted on the circuit board. The equivalent terms "LED board" and "LED panel" may be used interchangeably in the following. Similarly, the equivalent terms "ground" and "earth" may be used interchangeably.

It may be assumed in the following that the electronic device is driven by a driver that comprises a transformer and a means for suppressing electromagnetic interference arranged between a primary winding and a secondary winding of the transformer. In a particularly preferred embodiment of the invention, EMI suppression is provided by a Y-capacitor between the primary and secondary sides of the driver. It may also be assumed in the following, again without restricting the invention in any way, that the electronic device according to the invention is a device that comprises one or more LED panels, and that the driver is realized to convert a mains voltage into the necessary DC voltage and current required by the LED panels.

An LED package or "encapsulated LED" usually comprises one or more LED chips mounted on a metal-core printed circuit board (MCPCB) that is able to handle heat load. A back-plate of the metal-core printed circuit board serves as heatsink. To ensure that the LEDs do not overheat during operation, an LED package is generally also mounted onto its own heat spreader. The heat spreader may be a metal plate with an area that is usually larger than the LED package. Preferably, a "thermal pin" extends between the LED chip and the heat spreader and acts as an efficient heat transfer bridge between LED chip and heat spreader. Usually, an electrical connection is made between one of the LED electrodes and the heat spreader, so that these are at the same potential and the heat spreader itself can be regarded as the corresponding electrode. An LED panel is produced by serially connecting several such LED package/heat spreader modules on the heat sink given by the MCPCB, for example by connecting the heat spreader of one module to the LED anode of the next module. However, since a heat spreader (of an LED package) is separated from the MCPCB, for example a thin layer of plastic, a parasitic capacitance is created with one terminal being the metal of the heat spreader and the other terminal being the metal substrate of the MCPCB, i.e. the heatsink. In this way, an LED panel effectively presents a ladder network of LEDs and parasitic capacitors. When a common-mode surge current passes the driver, the parasitic capacitors start charging, and the high current flows through the LEDs, usually resulting in failure of the LED panel.

Preferably, a low impedance arrangement comprises a capacitor with a capacitance that is significantly greater than the total parasitic capacitance of the LED board. Preferably, the low-impedance arrangement comprises a capacitor arrangement with a total capacitance that is at least ten times greater than the total parasitic capacitance of the LED board. This ensures that surge current preferably flows through the low impedance arrangement and not through the parasitic capacitances and into the LEDs on the board.

As mentioned above, the surge-protection arrangement can be realized as part of the driver, as part of the load, or as a stand-alone unit. In each case, the surge-protection arrangement is connected between the driver and the load, i.e. between the output terminal(s) of the driver and the input terminal(s) of the load. In the following, the term "negative load connector" should be understood to mean a node or connector between driver and load in the "negative" power supply path, and the term "negative load terminal" is to be understood to mean the final cathode of the load, for example the final cathode of an LED panel. Similarly, the term "positive load connector" may be understood to mean a node or connector between driver and load in the "positive" power supply path, and the term "positive load terminal" is to be understood to mean the initial anode of the LED string of an LED panel. A negative output connector of the driver may be connected to the negative load connector, while a positive output connector of the driver may be connected to the positive load connector.

As explained above, a common-mode surge current can damage LEDs mounted onto a heat spreader when terminals of the LEDs are also connected electrically to the heat spreader. An LED can tolerate a relatively large forward current without suffering damage, so that the forward path of the common-mode surge current may not necessarily present a serious threat to the LEDs. However, the parasitic capacitances between the heat spreader and the metal layer of the MCPCB substrate open a reverse current path of the common-mode surge current through the LEDs in the "reverse direction", i.e. cathode to anode, which is critical and must be avoided if LED damage is to be prevented. Therefore, in a particularly preferred embodiment of the invention, the surge-protection arrangement comprises a high-impedance arrangement connected between the negative load connector and the negative load terminal; and a low impedance arrangement connected between the negative load connector and the functional earth connection to the heatsink. The high impedance arrangement effectively presents a high impedance from the point of view of the surge current, so that this is made to avoid the LED load, while the low impedance arrangement offers an attractive alternative path to ground, thus diverting the surge current from the LED load.

In some realizations, it may be desired to protect a load also from a forward current path of a common-mode current surge. Therefore, in a further preferred embodiment of the invention, the surge-protection arrangement also comprises a low impedance arrangement connected between the positive load connector and the functional earth, as well as a high-impedance arrangement connected between the positive load connector and the positive load terminal.

Preferably, a high impedance arrangement comprises an inductor, since an inductor "resists" a change in current magnitude, so that when the current suddenly increases, as is the case during a current surge, the inductor acts as an obstacle to current flow. To counteract any "ringing" that may ensue owing to the properties of the resonant tank formed by the inductor and the parasitic capacitors of the LED board, the high-impedance arrangement preferably also includes a ringing suppressor circuit portion. For example, a ringing suppressor circuit can be realized by arranging a series-connected Zener diode and resistor in parallel with the inductor.

As indicated above, it is important to decouple the load from electromagnetic interference, for example from the power supply. Therefore, in a further preferred embodiment of the invention, the electronic device also comprises a common-mode filter or choke across the positive and negative load terminals. Preferably, this precedes the surge-protection arrangement as seen from the driver end. Preferably, the choke is realized to filter out any unwanted frequencies.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
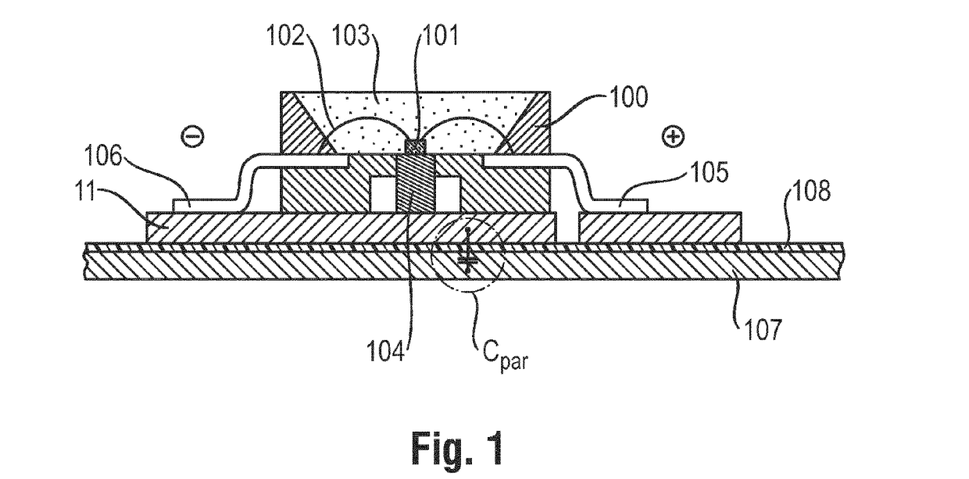
FIG. 1 shows a schematic cross-section through a packaged LED.

FIG. 1 shows a schematic cross-section through a packaged LED 100. The LED package 100 contains a light-emitting diode chip 101 for which the anode and cathode are connected by lead wires 102 to a "positive" connector 105 and a "negative" connector 106 respectively. The chip 101 is embedded in a material such as an epoxy, and the body of the package 100 can be shaped to collimate the light as appropriate. Since the LED chip 101 will become very hot during operation, it also has a heat spreader 11 to which a terminal 106 makes physical and thermal contact. The LED package 100 is mounted on a metal-core printed circuit board (MCPCB) that can handle the heat load. A metal backplate 107 of the MCPCB acts as a heatsink 107 and makes thermal contact to the heat spreader 11. In this example, the chip 101 is also mounted close to a thermal pin 104 extending through a cavity in the MCPCB, and is realized to make thermal contact to the heat spreader 11. To dissipate the heat effectively, the heat spreader 11 is created as a metal polygon of the MCPCB. The heat spreader 11 is separated from the metal backplate 107 by a thin layer of plastic isolation 108 and a parasitic capacitance $C_{par}$ ensues between the heat spreader 11 and the metal substrate/heatsink 107.

Figure 2:
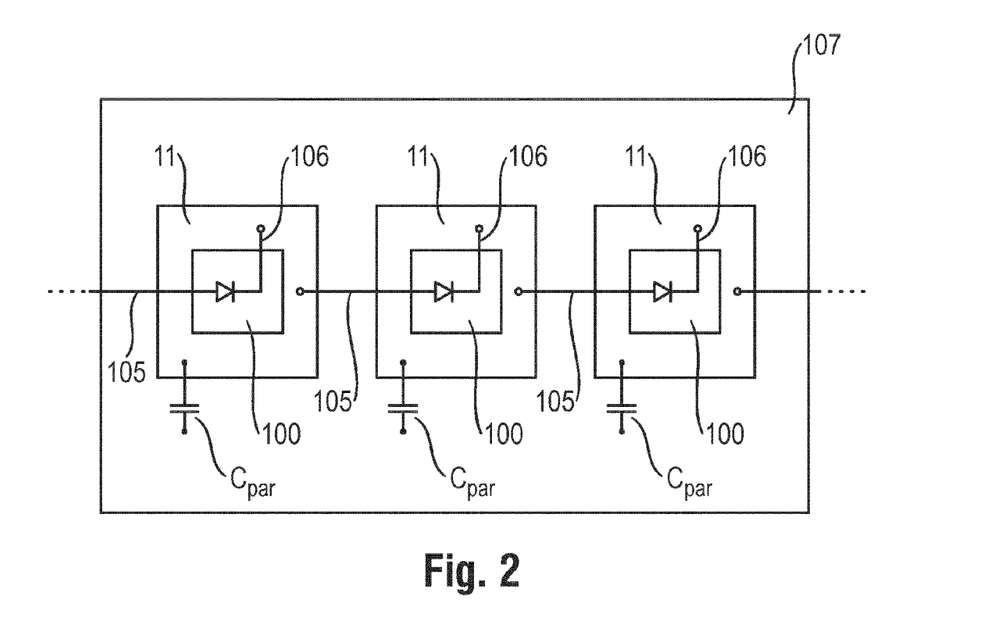
FIG. 2 shows a series arrangement of packaged LEDs of FIG. 1.

FIG. 2 shows a schematic representation of a series arrangement or string of packaged LEDs 100 mounted on heat spreaders 11 as described in FIG. 1 above. Here, the heat spreader 11 of each LED package 100 (electrically connected to its cathode 106 and therefore equipotential to the cathode 106) is connected to the anode 105 of the next LED package in the string. The parasitic capacitances $C_{par}$ between the heat spreaders 11 of each LED package 100 and the heat sink 107 can be regarded as part of a ladder network.

Figure 3:
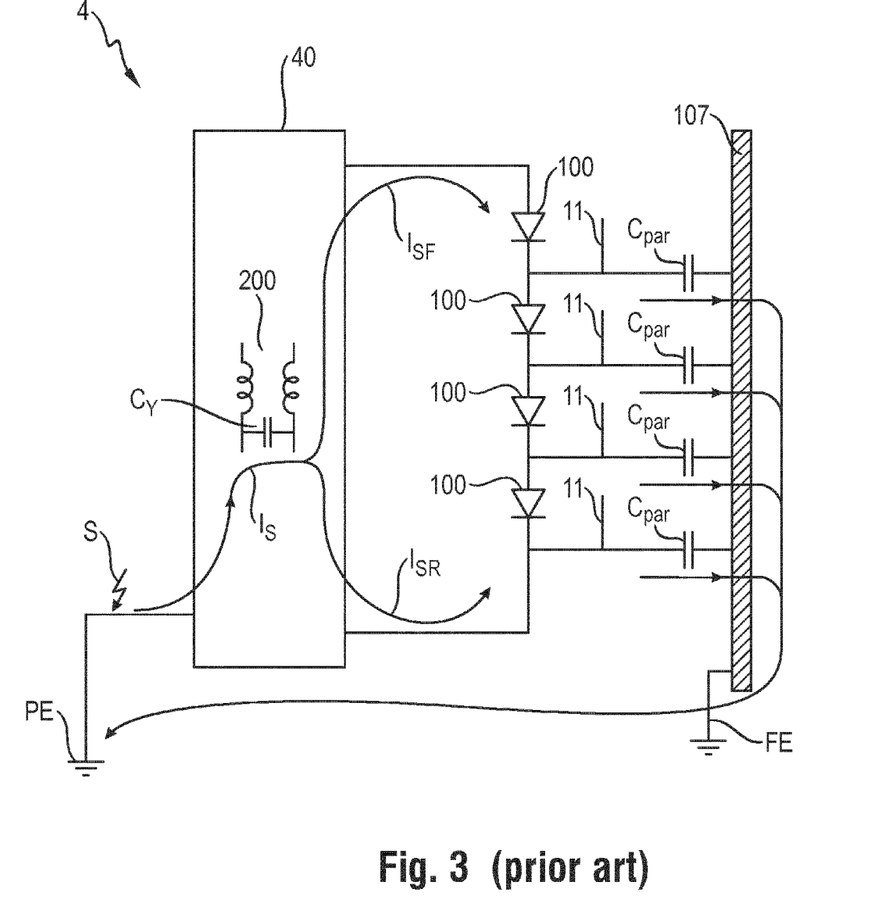
FIG. 3 shows a prior art circuit prone to surge current damage.
Figure 4:
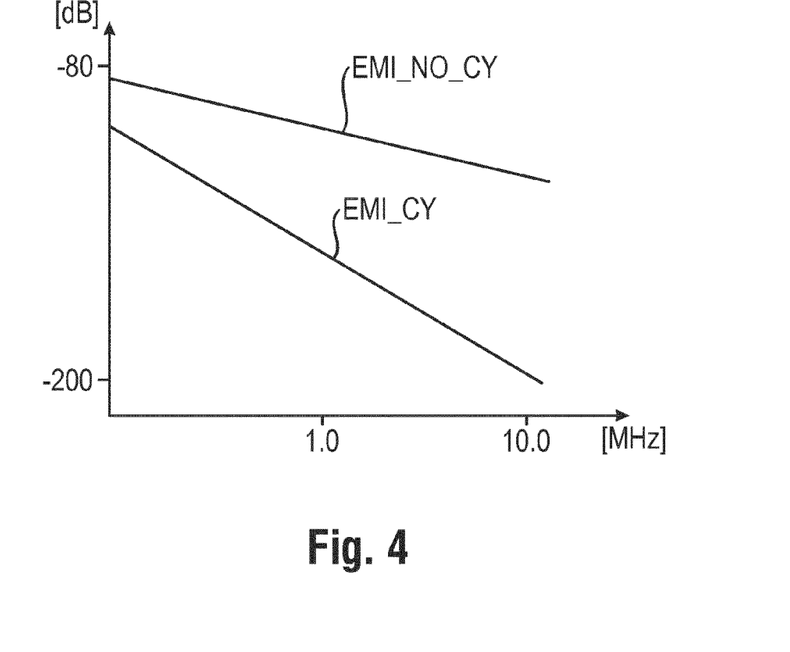
FIG. 4 shows plots of EMI attenuation.

This is shown in FIG. 3, which illustrates the problem with such a circuit in the event of a current surge. FIG. 3 shows a prior art electronic device 4, in this case a lighting arrangement 4 comprising a string of LEDs 100 and a driver 40. The driver 40 comprises a transformer 200 and a Y-capacitor $C_Y$ for reducing electromagnetic interference. Each LED 100 is connected as described above by one of its terminals to a heat spreader 11 (indicated schematically by a short vertical line in each case) so that it does not overheat during operation, and the usual parasitic capacitance $C_{par}$ ensues between each LED 100 and the heatsink 107. The LEDs 100 and parasitic capacitances $C_{par}$ effectively form a ladder network. In the event of a surge S, the driver's Y-capacitor facilitates a common-mode surge current $I_S$ to flow along the paths indicated in its effort to get to earth or ground through the driver's primary earth connector PE. The common mode surge current $I_S$ comprises a reverse surge current $I_{SR}$ and/or a forward surge current $I_{SF}$. When the parasitic capacitances $C_{par}$ charge up during a current surge, they open a current path through the LEDs. The peak surge current can generally be large enough to damage the LEDs 100 and destroy the lighting arrangement 4. This damage could be avoided by removing or splitting the Y-capacitor $C_Y$ from the driver's transformer 200. However, the significance of the Y-capacitor $C_Y$ is illustrated by FIG. 4. By incorporating a Y-capacitor between the windings of a driver transformer 200, as indicated by plot EMI_CY, a desired satisfactory level of EMI attenuation can be achieved. Here, an attenuation of about 140 dB is achieved at a driver frequency of 1.0 MHz. At even higher frequencies close to 10 MHz, attenuation in the region of 200 dB can be achieved. For this reason, prior art drivers, and the driver used in the electronic device according to the invention, include a Y-capacitor in their design. In contrast, plot EMI_NO_CY shows the effect of splitting or removing the Y-capacitor: at a driver frequency of 1.0 MHz, an attenuation of only about 95 dB is achieved, and an attenuation of only about 120 dB can be achieved at frequencies close to 10 MHz. For this reason, a driver comprising a Y-capacitor is preferred, and the problem of how to avoid surge current damage is solved by the surge-protection arrangement according to the invention as explained in the following.

Figure 5:
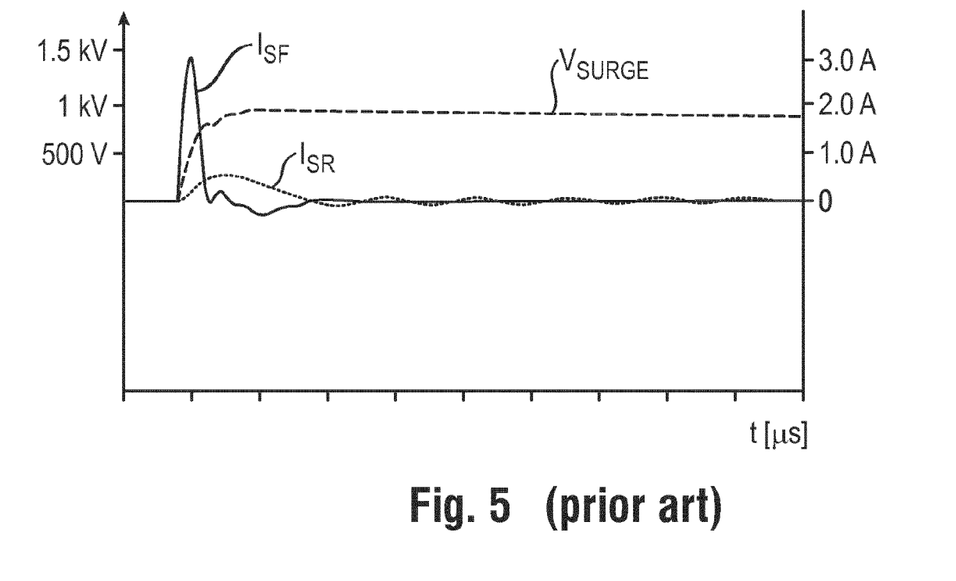
FIG. 5 shows LED current and voltage surge waveshapes for a prior art electronic device without surge protection.

FIG. 5 shows LED forward current $I_{SF}$ and LED reverse current $I_{SR}$ waveshapes that can result for a voltage surge $V_{SURGE}$ in a prior art electronic device that comprises an LED load, but does not have any surge protection. Here, a voltage surge reaches 1.0 kilovolt and persists for a few microseconds. As a result, a forward surge current $I_{SF}$ flows through the LEDs and can reach peak value of about 3.0 A. Most LEDs are designed to handle a forward current of only about 1.0 A-2.0 A. In practice a surge can reach 6 kV before being clamped by a suitable component such as a surge arrestor, for example a gas discharge tube. Applying linear interpolation, a surge at 6 kV will result in a surge current of 18 A, which would most certainly destroy the LEDs. The situation is more serious for the opposite direction, since an LED reverse current $I_{SR}$ can reach a value of 0.5 A-0.8 A which is enough to destroy the LEDs.

Figure 6:
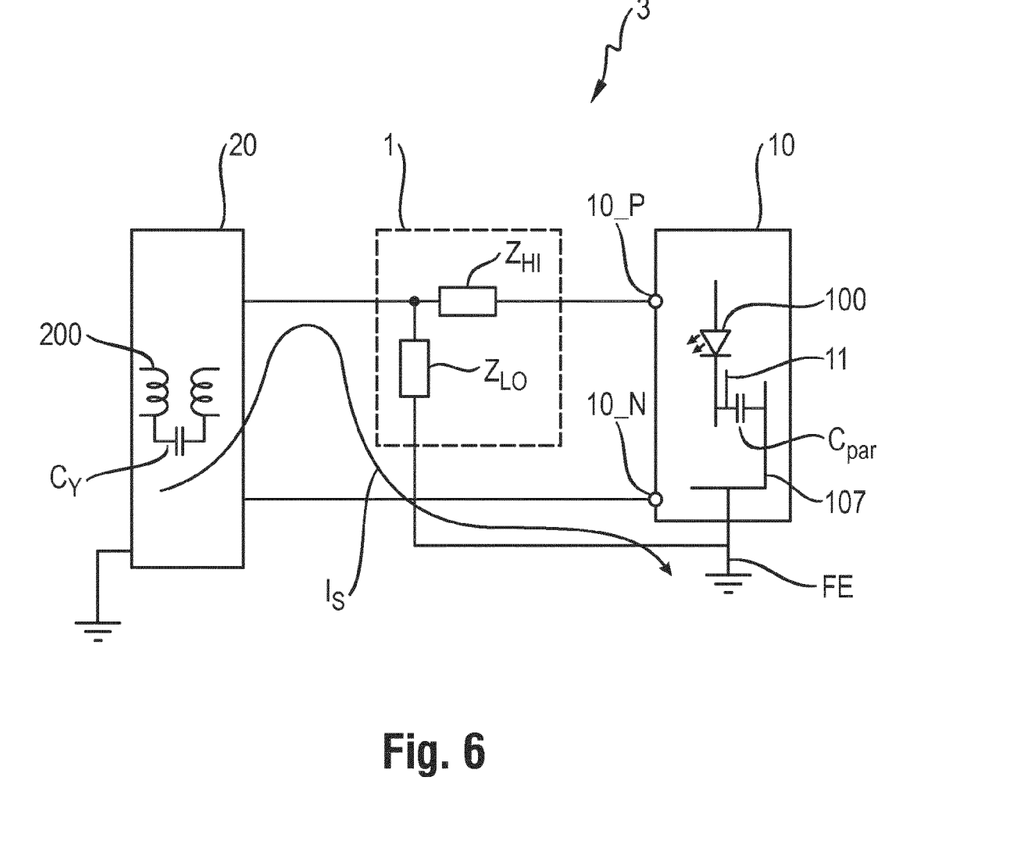
FIG. 6 is a schematic diagram of a first embodiment of the electronic device according to the invention.

FIG. 6 is a schematic diagram of a general embodiment of the electronic device 3 according to the invention. The device 3 has a heat-dissipating load 10 in which heat-dissipating load elements 100 are connected to a heat spreader 11 as described above. This is indicated here only schematically, and it will be understood that the load 10 can comprise any number of load elements 100, for example a string of power LEDs 100. The driver 20 comprises a transformer 200 with a Y-capacitor $C_Y$ to ensure favorable EMI performance. To avoid surge current damage, the electronic device 3 comprises a surge protection arrangement 1 according to the invention. The surge protection arrangement 1 includes a high impedance arrangement $Z_{HI}$ connected in series with the load 10 and a low impedance arrangement $Z_{LO}$ connected in parallel with the load 10. The surge protection arrangement 1 also comprises a ground connection FE arranged to electrically connect the low impedance arrangement $Z_{LO}$ and the heatsink 11 of the load 10. The high-impedance arrangement $Z_{HI}$ acts to discourage a common-mode surge current $I_S$ from entering the load 10, and the low-impedance arrangement $Z_{LO}$ acts to encourage such a common-mode surge current $I_S$ to bypass the load 10 into the ground connection FE.

During normal operation of the load using the DC voltage and current supplied by the driver, the high impedance arrangement $Z_{HI}$ and the low impedance arrangement $Z_{LO}$ have no effect on the load 10. Once the electronic device is turned on and the desired DC voltage is applied across the load terminals 10_P, 10_N, a capacitor $Z_{LO}$ charges up and then behaves as an "open connection". In contrast, an inductor LS1, LS2 will act as a "closed connection" shortly after starting up. It is only when a sudden change takes place, for instance a sudden current surge $I_S$, from the driver 20 to the load 10, that the high impedance arrangement $Z_{HI}$ and the low impedance arrangement $Z_{LO}$ act to protect the load 10.

Figure 7:
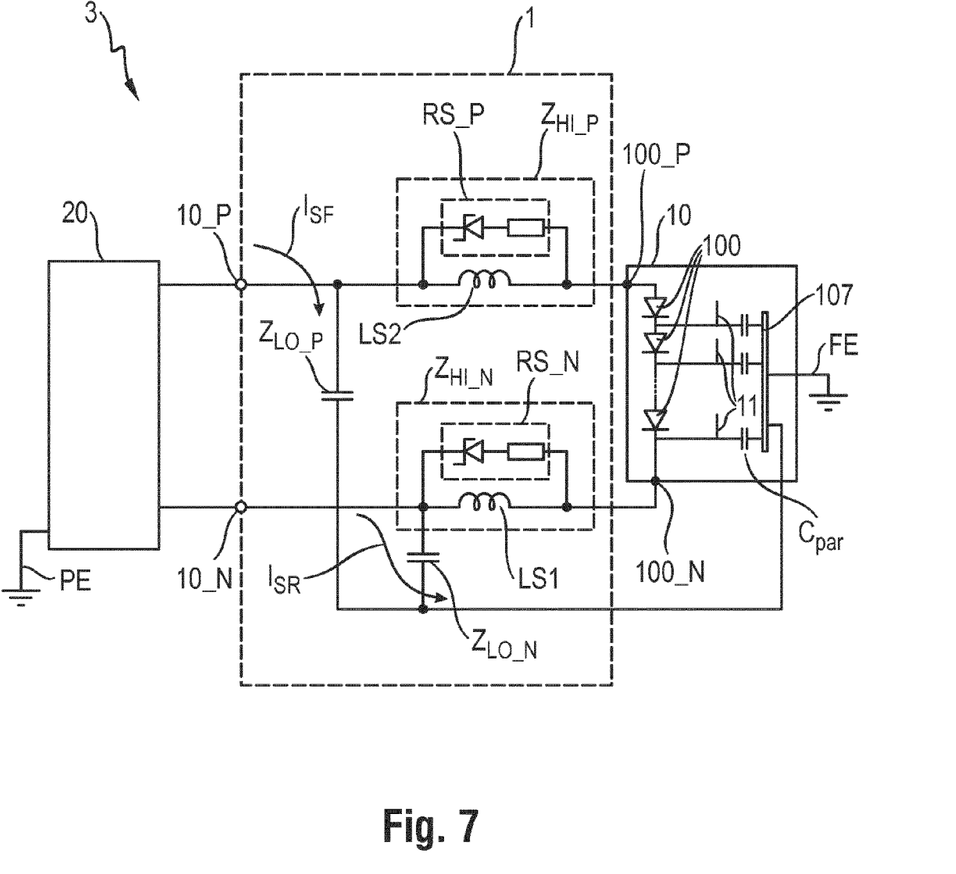
FIG. 7 is a schematic diagram of a second embodiment of the electronic device according to the invention.

The principle of operation of the inventive surge-protection arrangement is explained in more detail in FIG. 7, which shows an electronic device 3 with a load 10, a surge protection arrangement 1, and a driver 20, wherein the driver 20 is realized as described in FIG. 6 above. The surge protection arrangement 1 has a first high impedance arrangement $Z_{HI\_P}$ connected in series with the load 10 between a positive load connector 10_P and a positive load terminal 100_P; and a low impedance arrangement $Z_{LO\_P}$ connected in parallel with the load 10 between the positive load terminal 10_P and a ground connection FE that is electrically connected to the heatsink 107 of the load 10. The surge protection arrangement 1 also has a second high impedance arrangement $Z_{HI\_L}$ connected in series with the load 10 between a negative load connector 10_N and a negative load terminal 100_N; and a low impedance arrangement $Z_{LO\_N}$ connected in parallel with the load 10 between the negative load terminal 10_N and the ground connection FE. In this embodiment, each low impedance arrangement $Z_{LO\_P}$, $Z_{LO\_N}$ comprises a capacitor $Z_{LO\_P}$, $Z_{LO\_N}$, and the values of capacitance are chosen to be significantly greater that the total parasitic capacitance. For example, if the load comprises a string of ten LED modules 100 and each LED module 100 is associated with a parasitic capacitance $C_{par}$ of 120 pF, the capacitance of a low impedance arrangement $Z_{LO\_P}$, $Z_{LO\_N}$ is preferably at least 5.6 nF, for example 5.6 nF in the forward surge path ($Z_{LO\_P}$) and 5.6 nF in the reverse surge path ($Z_{LO\_N}$).

Also, in this embodiment, each high impedance arrangement $Z_{HI\_N}$, $Z_{LO\_P}$ comprises an inductor LS1, LS2 that acts to inhibit a surge current $I_{SF}$, $I_{SR}$ from following a path through the LEDs 100 and to offer the surge current $I_{SF}$, $I_{SR}$ a safe path to ground FE. For the example mentioned above and comprising ten LED modules 100, an inductor LS1, LS2 with a total value of 100 pH (e.g. 2×47 pH in series) may be sufficient to discourage a typical surge current $I_{SF}$, $I_{SR}$ from entering the load 10. In this example, each high impedance arrangement $Z_{HI\_N}$, $Z_{LO\_P}$ also comprises a ringing suppressor RS_N, RS_P arranged in parallel with the inductor LS1, LS2. Here, a ringing suppressor RS_N, RS_P is realized as a Zener diode in series with a resistance, and suitable components may be chosen by the skilled person.

Figure 8:
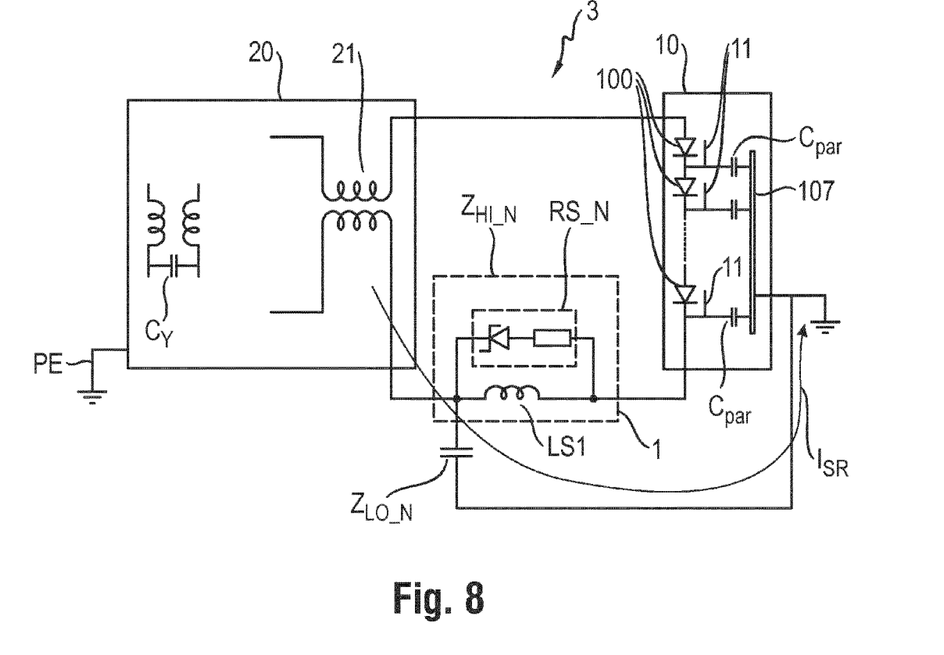
FIG. 8 is a schematic diagram of a third embodiment of the electronic device according to the invention.

FIG. 8 shows another embodiment of an electronic device 3 according to the invention, again with a load 10, a surge protection arrangement 1, and a driver 20 as described in FIG. 6 above. In this simpler embodiment, the surge protection arrangement 1 only has a high impedance arrangement $Z_{HI\_N}$ connected in series with the load 10 between the negative load connector 10_N and the negative load terminal 100_N; and a low impedance arrangement $Z_{LO\_N}$ connected in parallel with the load 10 between the negative load connector 10_N and the ground connection FE that is electrically connected to the heat spreader 11 of the load 10. The high-impedance arrangement $Z_{HI\_N}$ comprises a ringing suppressor RS_N as described in FIG. 6 above. With suitable choice of components for the capacitor $Z_{LO\_N}$ and inductor LS1, this realization can be enough to ensure that the LEDs are not damaged by a reverse surge current $I_{SR}$. Forward surge protection is not required in such a realization, since some LED types are immune to a forward surge. In this embodiment, the driver 20 also has a common-mode EMI choke 21 for filtering out unwanted EMI frequencies.

Figure 9:
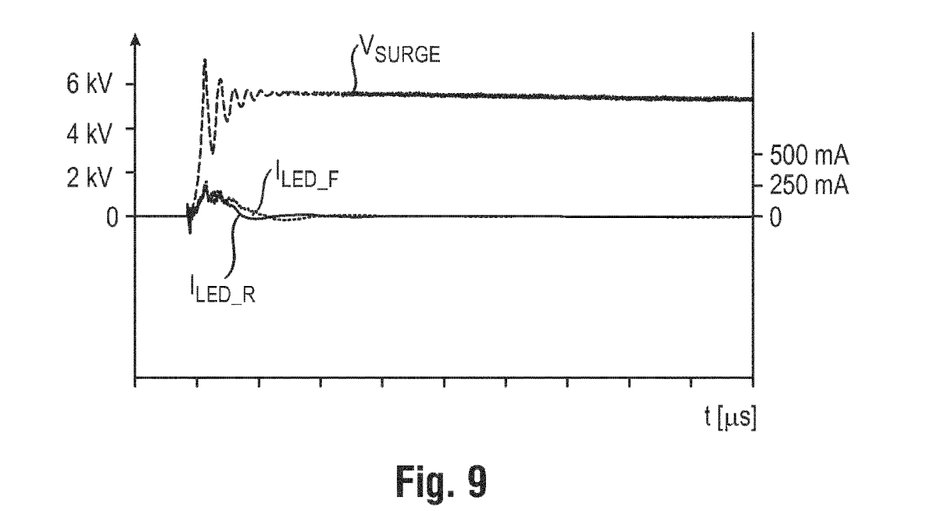
FIG. 9 shows LED current and voltage surge waveshapes for an electronic device according to the invention.

FIG. 9 shows LED forward current $I_{LED\_F}$ and LED reverse current $I_{LED\_R}$ waveshapes that can result for a voltage surge $V_{SURGE}$ in an electronic device of FIGS. 6 to 8 with an LED load and a surge protection arrangement according to the invention. Here, an even greater voltage surge reaches 6.0 kV and again persists for a few microseconds. Here, with the high impedance arrangement and low impedance arrangement of the surge protection arrangement according to the invention, the forward current $I_{LED\_F}$ through the LEDs only reaches a level of about 300 mA. Similarly, the reverse current $I_{LED\_R}$ through the LEDs does not exceed about 300 mA. By diverting most of the surge current safely to ground, the LEDs are only exposed to negligible current levels and remain undamaged by the surge.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A surge-protection arrangement for an electronic device comprising a heat-dissipating load thermally connected to a heat sink of the load, which surge protection arrangement comprises
at least one high impedance arrangement connected in series with the load;
at least one low impedance arrangement connected in parallel with the load; and
a ground connection arranged to electrically connect the heat sink and a low impedance arrangement;
wherein the high-impedance arrangement is realized to discourage a common-mode surge current from entering the load, and the low-impedance arrangement is realized to encourage a common-mode surge current to bypass the load into a ground connection.

2. A surge-protection arrangement according to claim 1, comprising a first low impedance arrangement connected between a negative load connector and the ground connection.

3. A surge-protection arrangement according to claim 1, comprising a second low impedance arrangement connected between a positive load connector and the ground connection.

4. A surge-protection arrangement according to claim 1, wherein a low impedance arrangement comprises a capacitor.

5. A surge-protection arrangement according to claim 1, comprising a first high impedance arrangement connected between a negative load connector and a negative load terminal.

6. A surge-protection arrangement according to claim 1, comprising a second high impedance arrangement connected between a positive load connector and a positive load terminal.

7. A surge-protection arrangement according to claim 1, wherein a high impedance arrangement comprises an inductor.

8. A surge-protection arrangement according to claim 1, wherein a high impedance arrangement comprises a ringing suppressor circuit portion.

9. An electronic device comprising
a load comprising a number of heat-dissipating components thermally connected to a heat sink of the load;
a driver realized to drive the load; and
a surge protection arrangement according to claim 1.

10. An electronic device according to claim 9, wherein the load comprises an LED lighting circuit with heat-dissipating light-emitting diodes, wherein a light-emitting diode is mounted to a heat spreader thermally connected to the heatsink.

11. An electronic device according to claim 10, wherein an LED comprises a thermal pin realized for thermal connection to the heat spreader.

12. An electronic device according to claim 9, wherein the driver comprises an EMI suppression means for suppressing electromagnetic interference between a primary side and a secondary side of the driver.

13. An electronic device according to claim 9, wherein the driver comprises a common-mode EMI choke realized to filter unwanted frequencies.

14. A driver realized to drive an LED lighting circuit, which driver comprises a surge protection arrangement according to claim 1 arranged for connection to the LED lighting circuit.

15. A method of providing protection against a common-mode surge current through an electronic device comprising a heat-dissipating load thermally connected to a heat sink of the load, which method comprises the steps of
connecting at least one high impedance arrangement in series with the load;
connecting at least one low impedance arrangement in parallel with the load;
electrically connecting a ground connection between the heat sink and a low impedance arrangement;
such that the common-mode surge current is discouraged by the high impedance arrangement from entering the load and encouraged by the low impedance arrangement to bypass the load into the ground connection.

* * * * *